(12) United States Patent
Yasuda

(10) Patent No.: US 9,607,931 B2
(45) Date of Patent: Mar. 28, 2017

(54) SEMICONDUCTOR DEVICE FOR SUPPRESSING A TEMPERATURE INCREASE IN BEAM LEADS

(71) Applicant: CALSONIC KANSEI CORPORATION, Saitama (JP)

(72) Inventor: Hiroki Yasuda, Saitama (JP)

(73) Assignee: Calsonic Kansei Corporation, Saitama (JP)

( * ) Notice: Subject to any disclaimer, the term of this patent is extended or adjusted under 35 U.S.C. 154(b) by 0 days.

(21) Appl. No.: 14/421,636

(22) PCT Filed: May 16, 2013

(86) PCT No.: PCT/JP2013/003117
§ 371 (c)(1),
(2) Date: Feb. 13, 2015

(87) PCT Pub. No.: WO2014/041722
PCT Pub. Date: Mar. 20, 2014

(65) Prior Publication Data
US 2015/0235923 A1    Aug. 20, 2015

(30) Foreign Application Priority Data
Sep. 12, 2012 (JP) ................. 2012-200305

(51) Int. Cl.
*H01L 23/48* (2006.01)
*H01L 23/52* (2006.01)
(Continued)

(52) U.S. Cl.
CPC .......... *H01L 23/4822* (2013.01); *H01L 24/46* (2013.01); *H01L 25/18* (2013.01);
(Continued)

(58) Field of Classification Search
CPC . H01L 2924/01026; H01L 2924/01079; H01L 2924/01078; H01L 2924/14; H01L 2924/01029; H01L 2924/01013
(Continued)

(56) References Cited

U.S. PATENT DOCUMENTS

2006/0071860 A1*  4/2006  Hozoji et al. .......... 343/700 MS
2007/0051974 A1   3/2007  Azuma et al.
(Continued)

FOREIGN PATENT DOCUMENTS

CN       1921105 A     8/2007
EP       1758440 A2    2/2007
(Continued)

OTHER PUBLICATIONS

Translation of International Search Report, PCT/JP2013/003117, mailed Jul. 9, 2013 (2 pages).
(Continued)

*Primary Examiner* — Lex Malsawma
*Assistant Examiner* — Nduka Ojeh
(74) *Attorney, Agent, or Firm* — Thomas J. Engellenner; Reza Mollaaghababa; Pepper Hamilton LLP

(57) ABSTRACT

Provided is a semiconductor device that can suppress a temperature increase in beam leads while reducing the number of wiring lines and can suppress an increase in manufacturing costs. The semiconductor device is provided with a power module including an upper arm and a lower arm each configured by connecting in parallel a plurality of power elements and a plurality of rectifying elements. Current to one arm flows through a plurality of separately wired beam leads. A portion of the power elements and a portion of the rectifying elements in one arm form a pair and are connected by a common beam lead.

2 Claims, 4 Drawing Sheets

(51) Int. Cl.
  *H01L 29/40* (2006.01)
  *H01L 23/482* (2006.01)
  *H01L 25/18* (2006.01)
  *H01L 23/00* (2006.01)

(52) U.S. Cl.
  CPC .............. *H01L 2224/4501* (2013.01); *H01L 2224/4502* (2013.01); *H01L 2924/1203* (2013.01); *H01L 2924/13055* (2013.01)

(58) Field of Classification Search
  USPC .......... 257/E23.052, E23.092, E25.016, 706, 257/712, 724, 784, 796, 734–735; 438/106–127
  See application file for complete search history.

(56) References Cited

U.S. PATENT DOCUMENTS

| | | | |
|---|---|---|---|
| 2009/0034306 A1* | 2/2009 | Inaba | B60L 11/18 363/131 |
| 2010/0036555 A1* | 2/2010 | Hosoda | B60L 3/003 701/22 |
| 2013/0207123 A1* | 8/2013 | Henning | H01L 29/7802 257/77 |

FOREIGN PATENT DOCUMENTS

| | | |
|---|---|---|
| JP | H0480065 U | 7/1992 |
| JP | 2004022960 A | 1/2004 |
| JP | 2004273749 A | 9/2004 |
| JP | 2006109576 A | 4/2006 |
| JP | 2008086099 A | 4/2008 |
| JP | 2008212977 A | 9/2008 |
| WO | 2008108159 A1 | 9/2008 |

OTHER PUBLICATIONS

Japanese Office Action dated Feb. 23, 2016 in Applicant's corresponding Japanese App. No. 2012-200305 (6 pages).

Office Action from Japanese Patent Office in corresponding Japanese Patent Application No. 2012-200305, dated Jan. 5, 2015 (6 pages).

Extended European Search Report in corresponding European Application No. 13837869.0, dated Dec. 3, 2015 (7 pages).

Chinese Office Action dated Nov. 2, 2016 in Applicant's corresponding Chinese patent App. No. 201380046664.5 (7 pages).

* cited by examiner

SEMICONDUCTOR DEVICE FOR SUPPRESSING A TEMPERATURE INCREASE IN BEAM LEADS

TECHNICAL FIELD

The present invention relates to a semiconductor device that includes a power module, having power elements and rectifying elements, in which the elements are wired with beam leads.

BACKGROUND ART

Patent Literature 1 discloses a known example of a conventional semiconductor device such as the one mentioned above.

This conventional semiconductor device has a paired arm structure formed by a positive side circuit and a negative side circuit. A first metal block is connected to the back side of a plurality of first semiconductor elements (power elements), and a second metal block is connected to the back side of a plurality of second semiconductor elements (rectifying elements). The front side of the first and second semiconductor elements and the first and second metal blocks are connected by a lead frame. The first and second metal blocks form a portion of a main electrode through which principle current flows. The first and second semiconductor elements, the first and second metal blocks, and the lead frame are integrally covered by a package. Within the package, the main electrode and a control electrode that are formed by the lead frame are disposed in nearly the same plane, except for the portion connecting to the first and second semiconductor elements and the first and second metal blocks.

CITATION LIST

Patent Literature

PTL 1: JP 2004-22960 A

SUMMARY OF INVENTION

Technical Problem

The above conventional semiconductor device, however, has the problems described below.

The above conventional semiconductor device, for example as illustrated in FIG. 2, includes a positive side input terminal P, a negative side input terminal N, and an output terminal O. Two Insulated Gate Bipolar Transistors (IGBT) and two Free Wheeling Diodes (FWD) are used in each of the upper and lower arms.

Basically, the following two methods are used when wiring such a two-chip parallel-connected power module with beam leads.

The layouts of semiconductor devices configured with these methods are illustrated in FIGS. 3 and 4. Note that in these figures, arrows depicted with solid lines indicate the direction of current when the IGBTs are operating, and arrows depicted with dashed lines indicate the direction of current when the FWDs are operating.

To begin with, in the first method, IGBTs in parallel as a two-chip set are each individually connected by beam leads, as illustrated in FIG. 3.

As illustrated in the same figure, in the upper arm, IGBTs 101*a* and 101*b* and diodes 102*a* and 102*b* fixed to a positive side pattern 104*a* on an insulating substrate 100 are individually connected by independent beam leads 103*a* to 103*d* to an output side pattern 104*c* on the insulating substrate 100.

On the other hand, in the lower arm, IGBTs 101*c* and 101*d* and diodes 102*c* and 102*d* fixed to the output side pattern 104*c* are individually connected by independent beam leads 103*e* to 103*h* to a negative side pattern 104*b* provided on the insulating substrate 100.

The positive side input terminal P is connected to the positive side pattern 104*a* at one edge of the insulating substrate 100, the negative side input terminal N is connected to the negative side pattern 104*b* at the same edge of the insulating substrate 100, and the output terminal O is connected to the output side pattern 104*c* at the other edge of the insulating substrate 100.

By thus wiring each element independently with an independent beam lead, the number of wiring lines and production steps grows large, leading to the problem of increased manufacturing costs.

In the second method, as illustrated in FIG. 4, the connection between each element and pattern is the same as the connection in FIG. 3, yet the method of wiring the beam leads differs.

Specifically, in the upper arm, IGBTs 101*a* and 101*b* are grouped as a two-chip set on the positive side pattern 104*a* and are connected to the output side pattern 104*c* by a beam lead 103*i*. Similarly, diodes 102*a* and 102*b* are grouped as a chip set on the positive side pattern 104*a* and are connected to the output side pattern 104*c* by a beam lead 103*j*.

On the other hand, in the lower arm, IGBTs 101*c* and 101*d* are grouped as a two-chip set on the output side pattern 104*c* and are connected to the negative side pattern 104*b* by a beam lead 103*k*. Similarly, diodes 102*c* and 102*d* are grouped as a two-chip set on the output side pattern 104*c* and are connected to the negative side pattern 104*b* by a beam lead 103*l*.

With this configuration, however, current flows simultaneously to a plurality of IGBTs or diodes connected by the same beam lead, causing the problem of the beam leads reaching a high temperature due to the high amount of current.

To avoid this problem, the beam leads need to be thickened, causing the problem of increased manufacturing costs.

The present invention has been conceived in light of the above problems and provides a semiconductor device with a power module that includes an upper arm and a lower arm each configured by connecting a plurality of power elements and a plurality of rectifying elements in parallel, with the elements wired by beam leads, such that a temperature increase in the beam leads can be suppressed while reducing the number of wiring lines, and such that an increase in manufacturing costs can be suppressed.

Solution to Problem

A semiconductor device according to a first aspect of the present invention is a semiconductor device comprising a power module including an upper arm and a lower arm each configured by connecting in parallel a plurality of power elements and a plurality of rectifying elements, current to one arm in the power module flowing through a plurality of separately wired beam leads, a portion of the power elements and a portion of the rectifying elements in the one arm forming a pair and being connected by a common beam lead.

A semiconductor device according to a second aspect of the present invention is a semiconductor device comprising a power module including an upper arm and a lower arm each configured by connecting in parallel a plurality of power elements and a plurality of rectifying elements identical in number to the power elements, current to one arm in the power module flowing through a plurality of separately wired beam leads, a portion of the power elements and a portion of the rectifying elements, identical in number to the portion of the power elements, in the one arm forming a pair and being connected by a common beam lead.

A semiconductor device according to a third aspect of the present invention is a semiconductor device comprising a power module including an upper arm and a lower arm each configured by connecting in parallel two power element chips and two rectifying element chips, current to one arm in the power module flowing through a plurality of separately wired beam leads, one of the power element chips and one of the rectifying element chips in the one arm forming a pair and being connected by a common beam lead.

Advantageous Effect of Invention

The semiconductor device in the first aspect is a semiconductor device provided with a power module including an upper arm and a lower arm each configured by connecting in parallel a plurality of power elements and a plurality of rectifying elements. Current to one arm in the power module flows through a plurality of separately wired beam leads. A portion of the power elements and a portion of the rectifying elements in the one arm form a pair and are connected by a common beam lead. Therefore, this pair of elements does not turn ON simultaneously.

As a result, the maximum current flowing through the beam leads can be reduced.

Accordingly, a temperature increase in the beam leads can be suppressed while reducing the number of wiring lines, thereby suppressing an increase in manufacturing costs.

The semiconductor device in the second aspect is a semiconductor device provided with a power module including an upper arm and a lower arm each configured by connecting in parallel a plurality of power elements and a plurality of rectifying elements identical in number to the power elements. Current to one arm in the power module flows through a plurality of separately wired beam leads. A portion of the power elements and a portion of the rectifying elements, identical in number to the portion of the power elements, in the one arm form a pair and are connected by a common beam lead. Therefore, this pair of elements does not turn ON simultaneously.

As a result, the maximum current flowing through the beam leads can be reduced, and nearly the same amount of current flows in each pair of identical numbers of power elements and rectifying elements, making it possible to prevent current from becoming uneven between beam leads.

Accordingly, a temperature increase in the beam leads can be suppressed while reducing the number of wiring lines, thereby suppressing an increase in manufacturing costs.

The semiconductor device in the third aspect is a semiconductor device provided with a power module including an upper arm and a lower arm each configured by connecting in parallel two power elements and two rectifying elements. Current to one arm in the power module flows through a plurality of separately wired beam leads. One of the power elements and one of the rectifying elements in the one arm form a pair and are connected by a common beam lead. Therefore, this pair of elements does not turn ON simultaneously.

As a result, the maximum current flowing through the beam leads can be reduced, and it is possible to prevent current from becoming uneven between beam leads.

Accordingly, in a power module with the above two-chip configuration as well, a temperature increase in the beam leads can be suppressed while reducing the number of wiring lines, thereby suppressing an increase in manufacturing costs.

BRIEF DESCRIPTION OF DRAWINGS

The present invention will be further described below with reference to the accompanying drawings, wherein.

DESCRIPTION OF EMBODIMENTS

Figure 1:
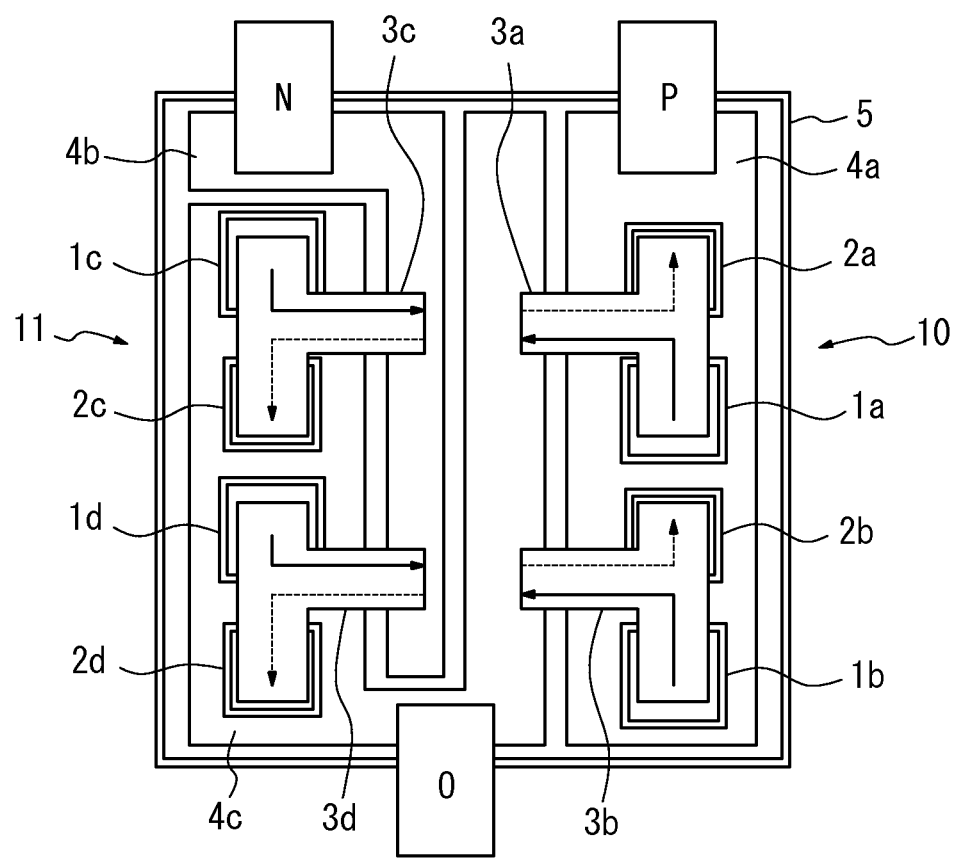
FIG. 1 illustrates the layout of power elements, rectifying elements, and the like, as well as the flow of current therein, in a semiconductor device according to an embodiment of the present invention.
Figure 2:
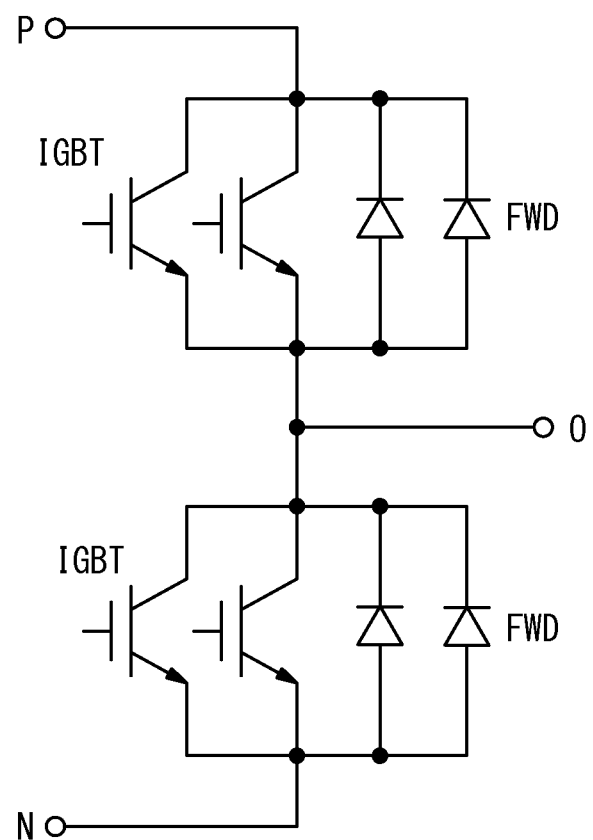
FIG. 2 is a circuit diagram of a semiconductor device according to a conventional technique, in which two-chip sets of power elements are connected by beam leads.
Figure 3:
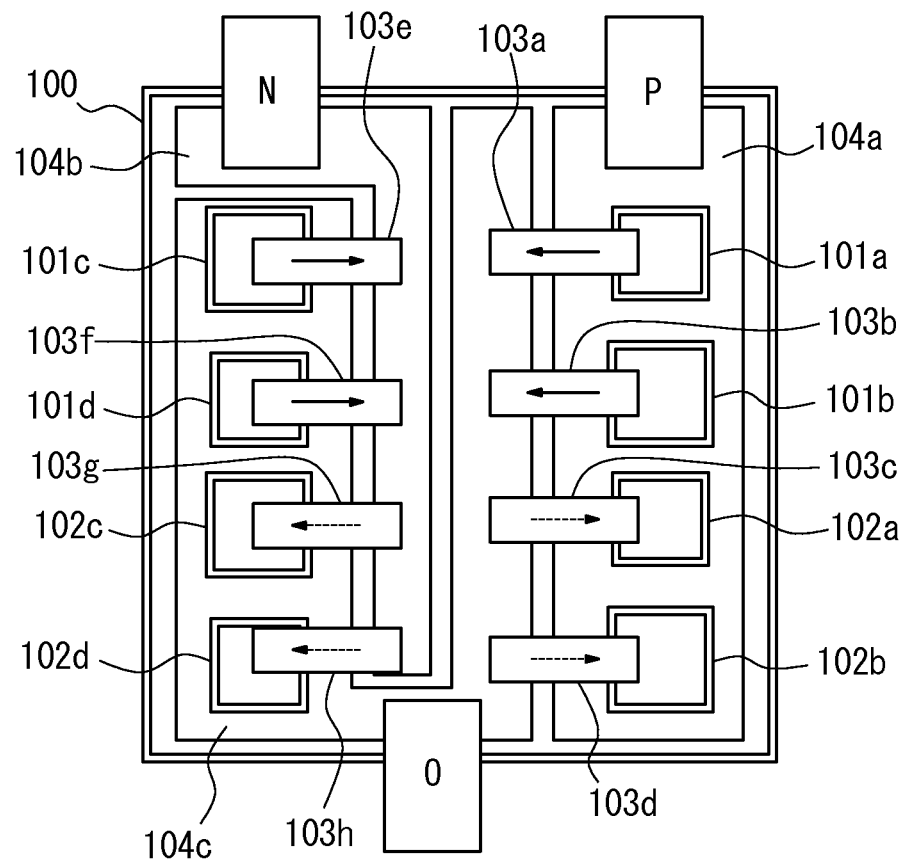
FIG. 3 illustrates the layout and the direction of current in a semiconductor device according to a conventional technique, in which each element in a two-chip set of power elements is individually connected by a beam lead.
Figure 4:
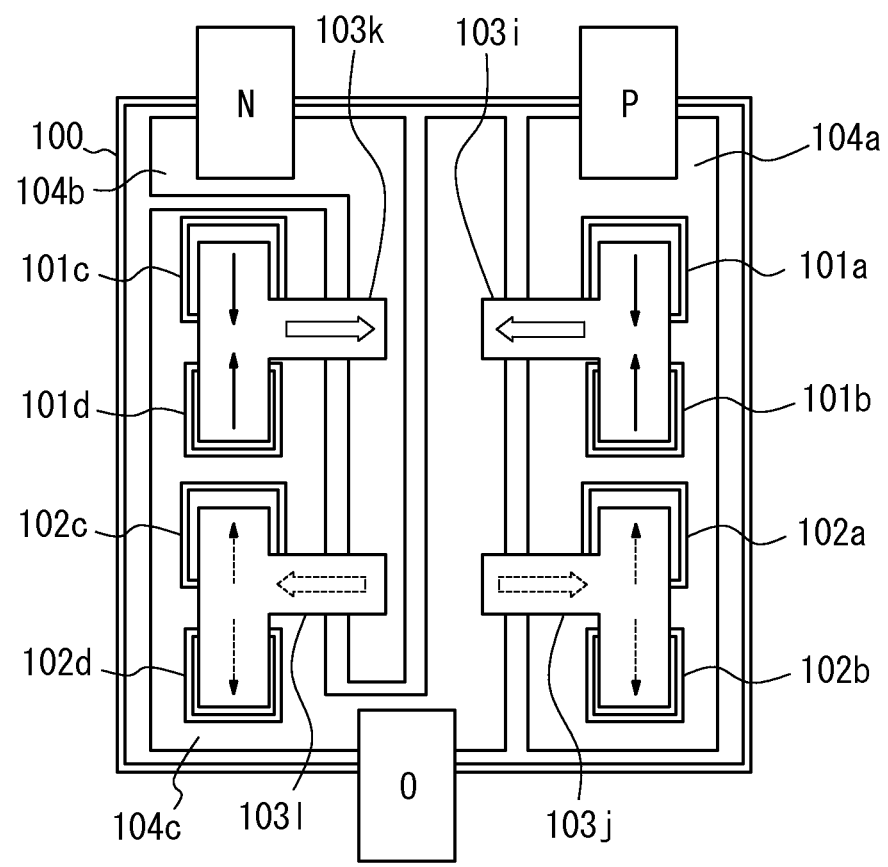
FIG. 4 illustrates the layout and the direction of current in a semiconductor device according to a conventional technique, in which a two-chip set of power elements is collectively connected by one beam lead.

The following describes embodiments of the present invention in detail, based on the embodiment illustrated in the drawings.

First, the overall configuration of a semiconductor device according to the present embodiment is described.

The semiconductor device of the present embodiment is, for example, used in an inverter that controls power supplied to an electric motor for driving that is mounted in an electric vehicle.

As illustrated in FIG. 1, the semiconductor device of the present embodiment as well is provided with a power module including an upper arm 10 configured by connecting in parallel two IGBTs 1a and 1b and two diodes 2a and 2b. The semiconductor device is also provided with a power module including a lower arm 11 configured by connecting in parallel two IGBTs 1c and 1d and two diodes 2c and 2d. These power modules are a portion of the above-mentioned inverter.

An insulating substrate 5 has fixed thereon the following: a rectangular positive side pattern 4a, formed from conducting metal, at the right in FIG. 1 (the upper arm side); a negative side pattern 4b, formed from conducting metal, extending horizontally from the left of FIG. 1 to near the approximate center and then turning downward and extending vertically downward to form an inverted L shape; and an output side pattern 4c, formed from conducting metal, extending from the top edge to the bottom edge in FIG. 1 at approximately the center position of FIG. 1 and then turning to the left (the bottom arm side), extending horizontally to the left edge, and rising vertically from the lower left edge to near the positive side pattern 4b to form a U shape.

At one edge of the insulating substrate 5 (at the top edge in FIG. 1), a positive side input terminal P is provided and connected to the positive side pattern 4a. At the same edge of the insulating substrate 5, a negative side input terminal N is provided and connected to the negative side pattern 4b.

At the other edge of the insulating substrate 5 (at the bottom edge in FIG. 1), an output terminal O is provided and connected to the output side pattern 4c.

At the upper arm side, the IGBT 1a and the diode 2a, for which to current flows in opposite directions, form a pair. For example, in the case of the IGBT 1a being an n-channel type, the collector side of the IGBT 1a and the cathode side of the diode 2a are fixed to the positive side pattern 4a provided on the insulating substrate 5. The emitter side of the IGBT 1a and the anode side of the diode 2a are grouped and connected to each other by one side of a beam lead 3a, and the other side of the beam lead 3a is connected to the output side pattern 4c provided on the insulating substrate 5. The IGBT 1a and the diode 2a are thus made conductive with each other by the beam lead 3a.

Similarly, the IGBT 1b and the diode 2b of the upper arm, for which current flows in opposite directions, form another pair. For example, in the case of the IGBT 1b being an n-channel type, the collector side of the IGBT 1b and the cathode side of the diode 2b are fixed to the positive side pattern 4a. The emitter side of the IGBT 1b and the anode side of the diode 2b are grouped and connected to each other by one side of a beam lead 3b, and the other side of the beam lead 3b is connected to the output side pattern 4c. The IGBT 1b and the diode 2b are thus made conductive with each other by the beam lead 3b.

On the other hand, at the lower arm side, the IGBT 1c and the diode 2c, for which current flows in opposite directions, form a pair. For example, in the case of the IGBT 1c being an n-channel type, the collector side of the IGBT 1c and the cathode side of the diode 2c are fixed to the output side pattern 4c. The emitter side of the IGBT 1c and the anode side of the diode 2c are grouped and connected to each other by one side of a beam lead 3c, and the other side of the beam lead 3c is connected to the negative side pattern 4b provided on the insulating substrate 5. The IGBT 1c and the diode 2c are thus made conductive with each other by the beam lead 3c.

Similarly, the IGBT 1d and the diode 2d of the lower arm, for which current flows in opposite directions, form another pair. For example, in the case of the IGBT 1d being an n-channel type, the collector side of the IGBT 1d and the cathode side of the diode 2d are fixed to the output side pattern 4c. The emitter side of the IGBT 1d and the anode side of the diode 2d are grouped and connected to each other by one side of a beam lead 3d, and the other side of the beam lead 3d is connected to the negative side pattern 4b. The IGBT 1d and the diode 2d are thus made conductive with each other by the beam lead 3d.

While not illustrated, a gate signal for control, determined by a control unit (not illustrated) in accordance with the amount of accelerator depression, vehicle speed, or the like, can be applied to the gate of each of the IGBTs 1a to 1d.

Three combinations that are similar to the combination of the upper arm 10 and the lower arm 11 are provided, and the output terminals thereof are connected to respective coils of a three-phase AC electric motor.

Next, the operations of the inverter that is a semiconductor device with the above-described configuration are described.

In the above-described semiconductor device, the IGBTs 1a and 1b of the upper arm 10 and the diodes 2c and 2d of the lower arm 11 form a step-down chopper, and the IGBTs 1c and 1d of the lower arm 11 and the diodes 2a and 2b of the upper arm 10 form a step-up chopper.

By complementary switching of the IGBTs 1a, 1b and 1c, 1d of the upper and lower arms 10 and 11, power conversion can be performed regardless of the polarity of the current.

In other words, by turning the IGBTs 1a and 1b of the upper arm 10 ON and the IGBTs 1c and 1d of the lower arm 11 OFF, positive reactor current flows through the IGBTs 1a and 1b of the upper arm 10 into the electric motor coil connected to the output terminal O. Conversely, by turning the IGBTs 1c and 1d of the lower arm 11 ON and the IGBTs 1a and 1b of the upper arm 10 OFF, negative reactor current flows through the IGBTs 1c and 1d.

The diodes 2a to 2d are used because, by causing the induced voltage energy generated by the electric motor to flow to the DC power source, the diodes 2a to 2d prevent the terminal voltage of the motor from rising due to the induced voltage, which would cause the IGBTs 1a to 1d to be damaged by overvoltage.

Furthermore, in the former case mentioned above in which positive reactor current flows, the diodes 2a and 2b of the upper arm 10 block current from flowing through these diodes 2a and 2b, whereas in the latter case mentioned above in which negative reactor current flows, the diodes 2c and 2d of the lower arm 11 block current from flowing through these diodes 2c and to 2d.

Accordingly, current does not flow simultaneously through both the IGBTs 1a and 1b and the diodes 2a and 2b of the upper arm 10, and similarly, current does not flow simultaneously through both the IGBTs 1c and 1d and the diodes 2c and 2d of the lower arm 11.

The IGBTs 1a and 1b of the upper arm 10 are connected individually by different beam leads 3a and 3b, and when the IGBTs 1a and 1b are ON, current does not flow to the diodes 2a and 2b connected to the beam leads 3a and 3b. Therefore, the current flowing through the beam leads 3a and 3b decreases.

Similarly, the IGBTs 1c and 1d of the lower arm 11 are connected individually by different beam leads 3c and 3d, and when the IGBTs 1c and 1d are ON, current does not flow to the diodes 2c and 2d connected to the beam leads 3c and 3d. Therefore, the current flowing through the beam leads 3c and 3d decreases.

Note that in FIG. 1, arrows depicted with solid lines indicate the direction of current when the IGBTs are operating, and arrows depicted with dashed lines indicate the direction of current when the diodes are operating.

As is clear from the above description, in the semiconductor device of the present embodiment, the power module includes the upper arm 10 and the lower arm 11 each configured by connecting the plurality of IGBTs 1a to 1d and the plurality of diodes 2a to 2d in parallel, and the current in one arm 10 (or 11) flows through the plurality of separately wired beam leads 3a to 3d. At this time, in the semiconductor device, a portion of the IGBTs 1a and 1b (and/or 1c and 1d) and a portion of the diodes 2a and 2b (and/or 2c and 2d) in the one arm 10 (or 11) form pairs and are connected by common beam leads 3a to 3d. Therefore, in these pairs, the IGBT and diode do not turn ON simultaneously, and hence current does not flow simultaneously to both elements.

In other words, only one chip's worth (either the IGBT or the diode in the pair) of current flows simultaneously through the beam leads 3a to 3d.

Accordingly, the amount of current flowing through the beam leads 3a to 3d can be suppressed and equalized. Therefore, the beam leads 3a to 3d can be prevented from reaching a high temperature, and the beam leads 3a to 3d need not be made large.

Furthermore, the beam leads 3a to 3d are fewer in number as compared to when beam leads are individually wired, thus suppressing an increase in manufacturing costs.

The present invention has been described based on the above embodiments, yet the present invention is not limited to these embodiments and includes any design modification or the like within the spirit and scope of the present invention.

For example, in the embodiment, each arm is configured to include two IGBTs and two diodes, yet this embodiment is not limiting. The case of one arm being configured with three or more each of the power elements and rectifying elements is included, and the semiconductor device may have a plurality of sets.

The present invention may also be applied just to a pair of only a portion of the plurality of power elements and rectifying elements in one arm.

REFERENCE SIGNS LIST 1a, 1b: IGBT (power element) at upper arm side
1c, 1d: IGBT (power element) at lower arm side
2a, 2b: Diode (rectifying element) at upper arm side
2c, 2d: Diode (rectifying element) at lower arm side
3a to 3d: Beam lead
4a: Positive side pattern
4b: Negative side pattern
4c: Output side pattern
5: Insulating substrate
10: Upper arm
11: Lower arm
N: Negative side input terminal
P: Positive side input terminal
O: Output terminal

The invention claimed is:

1. A semiconductor device comprising:
a plurality of first power elements and a plurality of first rectifying elements in an upper arm;
a positive side conductive pattern on which the plurality of first power elements and the plurality of first rectifying elements are disposed alternately in a line;
a plurality of second power elements and a plurality of second rectifying elements in a lower arm;
an output side conductive pattern on which the plurality of second power elements and the plurality of second rectifying elements are disposed alternately in a line;
a negative side conductive pattern;
a plurality of first beam leads, each of the plurality of first beam leads connecting a pair of one of the first power elements and an adjacent first rectifying element to the output side conductive pattern; and
a plurality of second beam leads, each of the plurality of second beam leads connecting a pair of one of the second power elements and an adjacent second rectifying element to the negative side conductive pattern.

2. The semiconductor device according to claim 1,
wherein the plurality of first beam leads and the plurality of second beam leads are T-shaped in a plan view, and
wherein the positive side conductive pattern, the output side conductive pattern and the negative side conductive pattern are disposed in the same plane, and
wherein a connecting point of each of the first beam leads to the output side conductive pattern is adjacent to a connecting point of each of the second beam leads to the negative side conductive pattern.

* * * * *